US011112773B2

(12) United States Patent
Trussell et al.

(10) Patent No.: US 11,112,773 B2
(45) Date of Patent: Sep. 7, 2021

(54) SYSTEMS FOR REMOVING AND REPLACING CONSUMABLE PARTS FROM A SEMICONDUCTOR PROCESS MODULE IN SITU

(71) Applicant: Lam Research Corporation, Fremont, CA (US)

(72) Inventors: David D. Trussell, Fremont, CA (US); Alan J. Miller, Fremont, CA (US); John Daugherty, Fremont, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 83 days.

(21) Appl. No.: 15/666,866

(22) Filed: Aug. 2, 2017

(65) Prior Publication Data

US 2018/0032062 A1 Feb. 1, 2018

Related U.S. Application Data

(63) Continuation of application No. 14/920,090, filed on Oct. 22, 2015, now abandoned.

(51) Int. Cl.
*G05B 19/418* (2006.01)
*H01L 21/67* (2006.01)

(52) U.S. Cl.
CPC ..... *G05B 19/418* (2013.01); *G05B 19/41875* (2013.01); *H01L 21/6719* (2013.01);
(Continued)

(58) Field of Classification Search
CPC ............ G05B 19/418; G05B 19/41875; G05B 2219/32212; G05B 2219/45031;
(Continued)

(56) References Cited

U.S. PATENT DOCUMENTS 4,930,634 A 6/1990 Williams et al.
5,223,112 A * 6/1993 Tepman ............ H01J 37/32623
204/298.11
(Continued)

FOREIGN PATENT DOCUMENTS

JP H04346247 A 12/1992
JP H08100260 A 4/1996
(Continued)

*Primary Examiner* — Christopher E. Everett
(74) *Attorney, Agent, or Firm* — Penilla IP, APC

(57) ABSTRACT

A cluster tool assembly includes a vacuum transfer module, a process module having a first side connected to the vacuum transfer module. An isolation valve having a first side and a second side, the first side of the isolation valve coupled to a second side of the process module. A replacement station is coupled to the second side of the isolation valve. The replacement station includes an exchange handler and a part buffer. The part buffer includes a plurality of compartments to hold new or used consumable parts. The process module includes a lift mechanism to enable placement of a consumable part installed in the process module to a raised position. The raised position provides access to the exchange handler to enable removal of the consumable part from the process module and store in a compartment of the part buffer. The exchange handler of the replacement station is configured to provide a replacement for the consumable part from the part buffer back to the process module. The lift mechanism is configured to receive the consumable part provided for replacement by the exchange handler and lower the consumable part to an installed position. The replacement by the exchange handler and the process module is conducted while the process module and the replacement station are maintained in a vacuum state.

18 Claims, 8 Drawing Sheets

(52) U.S. Cl.
CPC .............. *H01L 21/67167* (2013.01); *G05B 2219/32212* (2013.01); *G05B 2219/45031* (2013.01); *G05B 2219/50291* (2013.01); *Y02P 90/02* (2015.11)

(58) Field of Classification Search
CPC .... G05B 2219/50291; H01L 21/67167; H01L 21/6719; Y02P 90/22; Y02P 90/02
See application file for complete search history.

(56) References Cited

U.S. PATENT DOCUMENTS

| | | |
|---|---|---|
| 5,788,082 A | 8/1998 | Nyseth |
| 6,010,008 A | 1/2000 | Nyseth et al. |
| 6,092,981 A | 7/2000 | Pfeiffer et al. |
| 6,267,245 B1 | 7/2001 | Bores et al. |
| 6,776,289 B1 | 8/2004 | Nyseth |
| 7,121,414 B2 | 10/2006 | Beckhart et al. |
| 7,384,083 B2 | 6/2008 | Kent |
| 7,950,524 B2 | 5/2011 | Lin et al. |
| 7,993,458 B2 | 8/2011 | Kondo |
| 8,467,895 B2 | 6/2013 | Sekido |
| 8,919,563 B2 | 12/2014 | Gregerson et al. |
| 9,881,820 B2 | 1/2018 | Wong et al. |
| 10,062,589 B2 | 8/2018 | Wong et al. |
| 10,062,590 B2 | 8/2018 | Wong et al. |
| 10,062,599 B2 | 8/2018 | Genetti et al. |
| 10,124,492 B2 | 11/2018 | Genetti et al. |
| 10,427,307 B2 | 10/2019 | Genetti et al. |
| 2004/0242126 A1 | 12/2004 | Takeuchi |
| 2005/0087300 A1* | 4/2005 | Ishizawa ........... H01L 21/67173 156/345.31 |
| 2005/0205209 A1* | 9/2005 | Mosden ............ H01L 21/67069 156/345.31 |
| 2006/0151404 A1 | 7/2006 | Blattner et al. |
| 2008/0170929 A1 | 7/2008 | Ng |
| 2009/0003976 A1 | 1/2009 | Hofmeister et al. |
| 2009/0142163 A1 | 6/2009 | Genetti et al. |
| 2009/0279989 A1 | 11/2009 | Wong et al. |
| 2010/0032096 A1 | 2/2010 | Yu et al. |
| 2010/0211203 A1 | 8/2010 | Oka et al. |
| 2010/0267317 A1 | 10/2010 | Takahashi et al. |
| 2011/0031111 A1 | 2/2011 | Kobayashi |
| 2011/0218659 A1* | 9/2011 | Nomura .............. G05B 19/418 700/96 |
| 2012/0064734 A1 | 3/2012 | Takahashi |
| 2012/0070996 A1 | 3/2012 | Hao |
| 2013/0287528 A1 | 10/2013 | Gregerson |
| 2013/0308929 A1 | 11/2013 | Hsiao |
| 2014/0271083 A1* | 9/2014 | Caveney .......... H01L 21/67715 414/749.5 |
| 2017/0032997 A1 | 2/2017 | Willwerth et al. |
| 2017/0113355 A1 | 4/2017 | Genetti et al. |
| 2017/0117172 A1 | 4/2017 | Genetti et al. |
| 2017/0236737 A1 | 8/2017 | Gregerson et al. |
| 2018/0019145 A1 | 1/2018 | Sugawara |

FOREIGN PATENT DOCUMENTS

| | | | |
|---|---|---|---|
| JP | 2001179672 A | | 7/2001 |
| JP | 2006120799 A | | 5/2006 |
| JP | 2010016140 A | | 1/2010 |
| JP | 2011-54933 | * | 3/2011 |
| JP | 2011103391 A | | 5/2011 |

* cited by examiner

SYSTEMS FOR REMOVING AND REPLACING CONSUMABLE PARTS FROM A SEMICONDUCTOR PROCESS MODULE IN SITU

CLAIM OF PRIORITY

This application is a continuation of and claims priority from U.S. application Ser. No. 14/920,090, filed on Oct. 22, 2015, and entitled "Systems for Removing and Replacing Consumable Parts from a Semiconductor Process Module in Situ", which is incorporated herein by reference in its entirety.

BACKGROUND

1. Field of the Invention

The present embodiments relate to a cluster tool assembly used in manufacturing semiconductor wafer, and more particularly, to cluster tool assembly that enables removal and replacement of consumable parts within a process module disposed in the cluster tool assembly.

2. Description of the Related Art

A typical cluster tool assembly used in the manufacturing process to generate a semiconductor wafer includes one or more process modules with each process module used to perform a specific manufacturing operation, such as a cleaning operation, a deposition, an etching operation, a rinsing operation, a drying operation, etc. The chemistries and/or processing conditions used to perform these operations cause damage to some of the hardware components of the process module that are constantly exposed to the harsh conditions within the process module. These damaged hardware components need to be replaced promptly to ensure that the damaged hardware components do not expose other hardware components in the process module to the harsh conditions, and to ensure quality of the semiconductor wafer. For example, an edge ring that is disposed adjacent to a semiconductor wafer within a process module may get damaged frequently due to its location and continuous exposure to ion bombardment from a plasma generated within the process module that is used in an etching operation. The damaged edge ring needs to be replaced promptly to ensure that the damaged edge ring does not expose the underlying hardware components, such as a chuck, to the harsh process conditions. The hardware components that can be replaced are referred to herein as consumable parts.

The current process of replacing the damaged consumable part requires a trained service technician to perform a series of steps. The technician needs to bring the cluster tool assembly offline, pump/purge the cluster tool assembly to avoid exposure to toxic residuals, open the cluster tool, remove the damaged consumable part and replace the damaged consumable part with a new consumable part. Once the damaged part is replaced, the technician must then clean the cluster tool, pump the cluster tool assembly to vacuum and condition the cluster tool assembly for wafer processing. In some instances, the conditioning may involve qualifying the cluster tool assembly by running test process on the semiconductor wafer, taking cross-sections of the semiconductor wafer and analyzing the cross-sections to ensure the quality of the process operation. Replacing a damaged consumable part is a very involved and time-consuming process requiring the cluster tool assembly to be off-line for a considerable amount of time, thereby impacting the profit margin for a semiconductor manufacturer.

It is in this context that embodiments of the invention arise.

SUMMARY

Embodiments of the invention define a cluster tool assembly that is designed to remove and replace damaged hardware components of a process module disposed within the cluster tool assembly without a need to break vacuum (i.e., expose the cluster tool assembly to atmospheric condition). A damaged hardware component that can be replaced is also referred to herein as a consumable part. The cluster tool assembly includes one or more process modules, with each process module configured to perform a semiconductor wafer processing operation. As the consumable part in a process module gets exposed to the chemicals and process conditions, the consumable part gets damaged and needs to be replaced in a timely manner. The damaged consumable part may be replaced without opening the cluster tool assembly by mounting a replacement station to the cluster tool assembly. The replacement station and the process module are coupled to a controller to enable the controller to coordinate access between the replacement station and the process module while the process modules is maintained in a vacuum state, so as to allow replacement of the consumable part.

To provide easy access to the damaged consumable part, the process module may be designed to include a lift mechanism. When engaged, the lift mechanism is configured to allow the consumable part to be moved to a raised position within the process module so that a robot available within the cluster tool assembly may be used to access and retrieve the raised consumable part from the process module. A replacement consumable part is provided to the process module and the lift mechanism is used to receive the consumable part and lower into position in the process module.

By providing the replacement station to access the consumable part, a need to open the cluster tool assembly to atmospheric conditions in order to access the damaged consumable part, is eliminated. The replacement station is maintained at vacuum, in some implementations, thereby eliminating the risk of contamination during replacement of the consumable part. As a result, the time required to recondition the process module after replacement of the damaged consumable part to bring it to an active operation state, is substantially reduced. Further, the robot and the lift mechanism allow replacement of the consumable part without the risk of inadvertently damaging any hardware in the process modules during retrieval and replacement of the consumable part.

Embodiments of the disclosure provide a cluster tool assembly that can be used to remove and replace the consumable part from a process module without requiring the cluster tool assembly to be opened to atmospheric conditions. The replacement station reduces risk of contamination of the cluster tool assembly and damage to the hardware components of the process module during installation and removal of the consumable parts. As the cluster tool assembly is not opened, the cluster tool assembly does not require to be purged or pumped. As a result, the time required to condition and qualify the cluster tool assembly is considerably reduced.

The replacement station may be disposed in three different positions. In one position, a roll-up replacement station is temporarily mounted to a process module within a cluster tool assembly, with ability to pump to vacuum and retract the consumable part directly from the process module. A new consumable part is directly placed into the process module. In this position, the replacement station would include a robot and part buffer for holding used and new consumable parts. An isolation valve would remain on the process module. This configuration is desired since only the process module, not the entire cluster tool assembly, would have to be offline for this maintenance activity.

In a second position, the replacement station is permanently mounted to a vacuum transfer module (VTM) and a robot within the VTM is utilized to remove and replace the consumable part from the process module. In this position, the replacement station does not require a dedicated robot, but an end effector of the VTM robot would handle moving both semiconductor wafers and the consumable parts.

In a third position, the replacement station is permanently mounted to an atmospheric transfer module (ATM) and utilize a robot of the ATM and a robot of a vacuum transfer module (VTM) to remove and replace the consumable part from the process module. In this position, the replacement station would not require a dedicated robotic arm, but the VTM and ATM robot end effectors, as well as a loadlock chamber disposed between the ATM and the VTM would handle both the semiconductor wafers and the consumable parts.

The process module includes a consumable part lift mechanism. The consumable part is usually a ring, such as an edge ring. The consumable part would have to be lifted so that a robot could extract it. In one embodiment, the lift mechanism includes a vacuum-sealed actuator outfitted with a lift pin. In another embodiment, the actuator is maintained at vacuum. Under normal operation, the lift stays retracted and not in contact with the consumable part. When the consumable part needs to be replaced, the actuator extends the lift pin and raises the consumable part. The robot extends the end effector into the process module so that the end effector (for example, a spatula-shaped part attached to the robot) slides underneath the consumable part. The actuator then retracts the lift pin, placing the consumable part on the end effector. The consumable part is pulled back into the replacement station. A reverse order is used to place a new consumable part in the process module.

In one embodiment, a cluster tool assembly is disclosed. The cluster tool assembly includes a vacuum transfer module that includes a first robot. A plurality of process modules is coupled to the vacuum transfer module. An atmospheric transfer module includes a second robot and is coupled to the vacuum transfer module via a load lock. A replacement station is coupled to the atmospheric transfer module. The replacement station has a part buffer with a plurality of compartments for storing a plurality of consumable parts used in one or more of the plurality of process modules. An isolation valve is coupled between the replacement station and the atmospheric transfer module. The second robot is configured to retrieve consumable parts for installation in one or more of the plurality of process modules and store consumable parts removed from one or more of the plurality of process modules. The first robot of the vacuum transfer module is configured to handle the consumable parts for installation or removal from the one or more of the plurality of process modules and the second robot of the atmospheric transfer module is configured to handle the consumable parts retrieved from the replacement station and stored when removed from the one or more of the plurality of process modules.

In another embodiment, a cluster tool assembly is disclosed. The cluster tool assembly includes a vacuum transfer module including a first robot. A plurality of process modules is coupled to the vacuum transfer module. A replacement station is coupled to the vacuum transfer module. The replacement station has a part buffer with a plurality of compartments for storing a plurality of consumable parts used in one or more of the plurality of process modules. An isolation valve is coupled between the replacement station and the vacuum transfer module. The first robot is configured with access to the replacement station via the isolation valve to retrieve consumable parts for installation in one or more of the plurality of process modules and store consumable parts removed from the one or more of the plurality of process modules. The first robot of the vacuum transfer module is configured to handle the consumable parts for installation or removal from the one or more of the plurality of process modules.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DESCRIPTION

Figure 1:
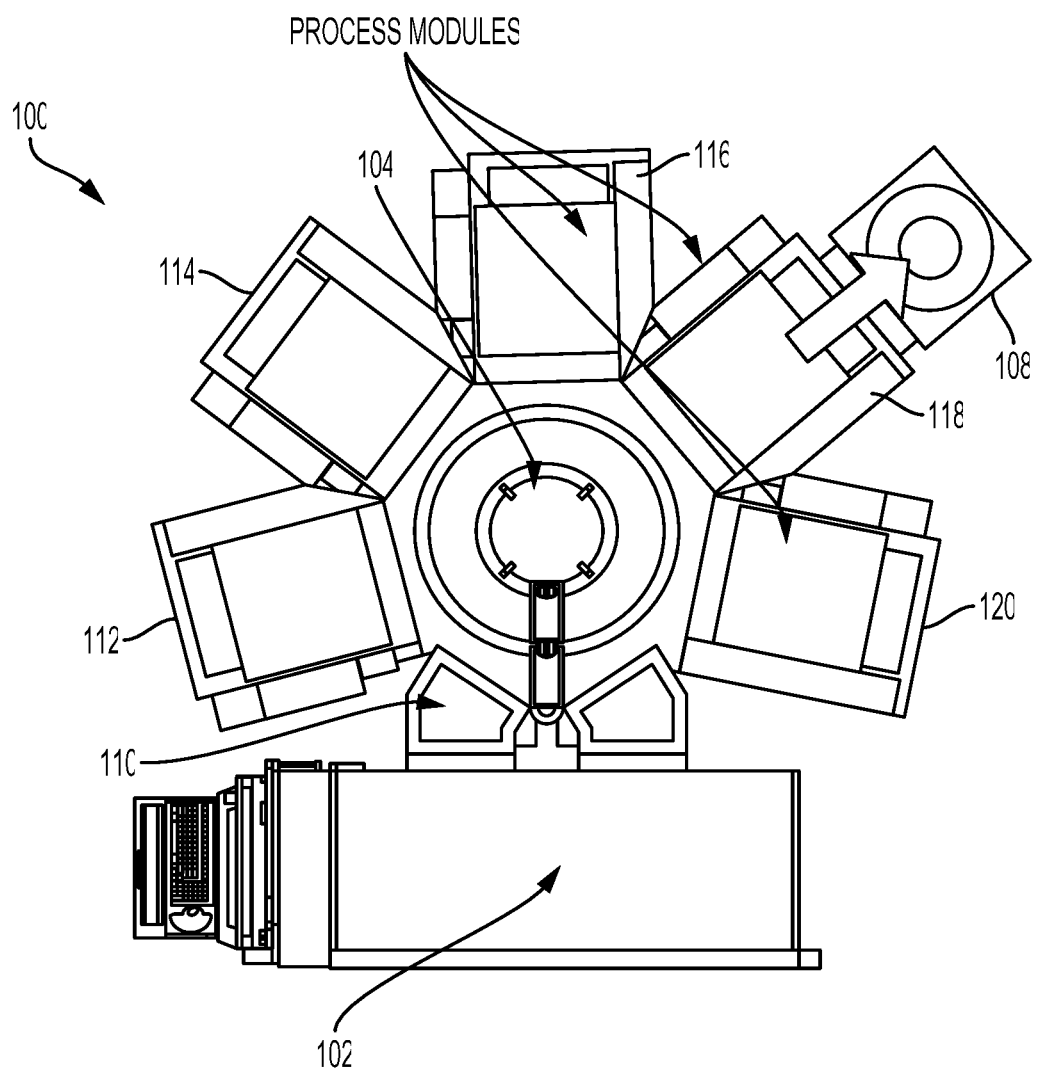
FIG. 1 illustrates a simplified block diagram of a cluster tool assembly that includes a replacement station mounted to a process module that is used in processing a semiconductor wafer, in one embodiment of the invention.

Embodiments of the disclosure define a cluster tool assembly that is used to process a semiconductor wafer. The cluster tool assembly includes a process module that is used to process a semiconductor wafer. A replacement station is mounted to the cluster tool assembly. The replacement station is maintained at vacuum so as to provide the necessary process condition for replacement of the consumable part without risk of contaminating the process module or the cluster tool assembly. A dedicated robot within the replacement station or the robot available within the cluster tool assembly is used to retrieve a used consumable part from the process module and replace with a new consumable part.

In some embodiments, the replacement station may be mounted directly to a process module of a cluster tool assembly in which a consumable part needs to be replaced. In such embodiments, the replacement station is coupled directly to the process module. A robot defined in the replacement station is used to retrieve and replace the consumable part.

In some other embodiments, the replacement station may be mounted directly to a vacuum transfer module (VTM) within a cluster tool assembly. The replacement station is mounted so as to maintain uniformity and symmetry of the cluster tool assembly. A robot of the VTM that is used to move a semiconductor wafer into and out of process modules is also used to retrieve and replace a consumable part disposed in a process module.

In some other embodiments, the replacement station may be mounted directly to an atmospheric transfer module of a cluster tool assembly. In such embodiments, a robot of the atmospheric transfer module works with a robot of a vacuum transfer module of the cluster tool assembly to access and replace the consumable part from a process module. The replacement station is designed to mount to different modules of the cluster tool assembly and enable replacing of the consumable part without requiring the cluster tool assembly to be opened to atmospheric conditions to access the consumable part.

Traditional design of a cluster tool assembly required the cluster tool assembly to be opened in order to access and replace the consumable part within a process module. Opening of the cluster tool assembly required taking the cluster tool assembly offline and purging the cluster tool assembly to atmospheric condition to allow access to the process modules. Once the cluster tool assembly is opened, a trained technician would manually remove and replace the consumable part from a process module. Upon replacement of the consumable part, the cluster tool assembly had to be conditioned so that the semiconductor wafer can be processed. Since the semiconductor wafers are valuable products, extreme care has to be taken when conditioning the cluster tool assembly. The conditioning would require cleaning the cluster tool assembly, pumping the cluster tool assembly to vacuum, conditioning the cluster tool assembly and qualifying the cluster tool assembly using test runs. Each of these steps requires considerable time and effort. In addition to the time required at every step to condition the cluster tool assembly, additional delays may be experienced when problems are encountered at one or more of the steps during the conditioning of the cluster tool assembly. Some of the problems commonly encountered during the conditioning of the cluster tool assembly may include misalignment of the consumable part during replacement, damage to the new consumable part when replacing a damaged or used consumable part, damage to other hardware components in the process module during retrieval or replacement of the consumable part, cluster tool assembly not achieving vacuum after pumping, cluster tool assembly not achieving process performance, etc. Based on the severity of each problem, additional time and effort may have to be expended, further contributing to delay of bringing the cluster tool assembly online, directly impacting the profit margin for a manufacturer.

Mounting a replacement station to the cluster tool assembly and accessing the consumable part through the replacement station saves considerable amount of time and effort required for maintaining the cluster tool assembly. The risk of damage to the consumable part, process module and/or the cluster tool assembly is minimized by using a robot available within the cluster tool assembly for replacing the consumable part, and the risk of contamination is minimized by maintaining the replacement station at vacuum, thereby avoiding exposure of the inside of the cluster tool assembly to outside atmosphere. Using the robot, one can achieve a more precise alignment of the consumable part in the process module while minimizing damage to other hardware components of the process module. Consequently, time required to condition the cluster tool assembly is greatly reduced. Timely replacement of the consumable parts increases quality and yield of semiconductor components defined in the semiconductor wafer.

FIG. 1 illustrates a simplified schematic diagram of a cluster tool assembly 100 that is used to process a semiconductor wafer, in one embodiment. The cluster tool assembly 100 includes a plurality of modules to allow the semiconductor wafer to be processed in a controlled environment with minimal exposure of the semiconductor wafer to environment. The cluster tool assembly 100, in one embodiment, includes an atmospheric transfer module (ATM) 102, a common vacuum transfer module (VTM) 104 and one or more process modules 112-120. The ATM 102 is operated under ambient (i.e., atmospheric) condition and interfaces with a wafer loader (not shown) to bring a semiconductor wafer into the integrated cluster tool assembly 100 for processing, and for returning the semiconductor wafer, after processing. The ATM 102 may include a robot to move the semiconductor wafer from the wafer loader to the VTM 104. The robot may be part of a dry robot as the ATM 102 is at atmospheric condition.

The VTM 104 is operated under vacuum so as to minimize exposure of the semiconductor wafer surface to atmospheric air as the semiconductor wafer is moved from one process module into another. Since, the VTM 104 is operating under vacuum and the ATM 102 is operating at atmospheric condition, a loadlock chamber 110 is placed between the ATM 102 and the VTM 104. The loadlock chamber 110 provides a controlled interface to allow the transfer of the semiconductor wafer from the ATM 102 in to the VTM 104. In this embodiment, the robot within the ATM 102 may be used to deposit the semiconductor wafer into the loadlock chamber 110. A separate robot may be provided within the VTM 104 to retrieve the semiconductor wafer from the loadlock chamber 110 and transfer the semiconductor wafer into and out of process module (112-120).

The one or more process modules 112-120 are integrated with the VTM 104 so as to allow the semiconductor wafer to move from one process module to another process module in a controlled environment maintained by the VTM 104. In some embodiments, the process modules 112-120 may be distributed uniformly around the VTM 104 and are used to perform distinct process operations. Some of the process operations that can be carried out using the process modules 112-120 include etch operation, rinsing, cleaning, drying operation, plasma operation, deposition operation, plating operation, etc. By way of example, process module 112 may be used to perform a deposition operation, process module 114 may be used to perform a cleaning operation, process module 116 may be used to perform a second deposition operation, process module 118 may be used to perform an etch or removal operation, and so on. The VTM 104 with the controlled environment allows the semiconductor wafer to be transferred into and out of the process modules 112-120 without risk of contamination and the robot within the VTM 104 assists in transferring the semiconductor wafer into and out of the various process modules 112-120 that are integrated with the VTM 104.

In one embodiment, a replacement station 108 is mounted to a process module (e.g., any one of the process modules 112-120) within the cluster tool assembly 100. In the example embodiment illustrated in FIG. 1, the replacement station 108 is mounted to process module 118. The replacement station may be configured to mount to any of the other process modules 112-120, as and when consumable part(s) needs to be replaced in the respective process modules 112-120. The process module 118, for example, may be used to perform an etch operation. The replacement station 108 is used to retrieve and replace a consumable part that is used in the process module 118. The replacement station 108 includes a mechanism, such as a pump mechanism, (not shown) to pump and maintain the replacement station 108 at vacuum, when mounted to the process module.

In one embodiment, the replacement station 108 may be coupled to the process module (i.e., any one of process modules 112-120) through an isolation valve, when a consumable part needs to be replaced at the process module (112-120) and de-coupled from the process module (112-120) when the consumable part has been successfully replaced. In this embodiment, the replacement station 108 is a moveable modular unit that is designed to be temporarily mounted to a process module to complete the required operation (e.g., replacement of consumable part), dismounted once the required operation at the process module is completed, and either retracted or moved to a different process module where the required operation of replacing the consumable part is performed. For example, the isolation valve allows the replacement station 108 to be maintained at vacuum.

The replacement station 108 includes a part buffer to receive and hold the consumable part. In some embodiments, the part buffer may include a plurality of compartments for receiving the used consumable parts that are retrieved from a process module and new consumable parts that are to be delivered to the process module. In one embodiment, an opening in the replacement station 108, where the replacement station is mounted to the isolation valve, is sized to allow the movement of the consumable part into and out of the replacement station 108.

The consumable part is a hardware part within the process module that needs to be replaced due to its continuous exposure to the process conditions within the process module. As a result of its continuous exposure to the harsh process conditions used during processing of the semiconductor wafer, the consumable part needs to be closely monitored to determine when damage has exceeded an acceptable level so that it can be promptly replaced. For example, in an etch process module, an edge ring is disposed adjacent to the semiconductor wafer mounted on a chuck assembly to extend the process region of the semiconductor wafer. During the etching operation, the edge ring is exposed to the ion bombardment from the plasma that is used to form features on a surface of the semiconductor wafer. Over a course of time, as a result of continuous exposure, the edge ring may get damaged. When the edge ring gets damaged beyond an acceptable level, the edge ring needs to be replaced so that damage of the edge ring does not expose other underlying components or otherwise adversely affect the semiconductor wafer processing.

In a typical etch operation, ions from the plasma hit the semiconductor wafer surface at an angle that is perpendicular to a plasma sheath formed in a process region defined above the semiconductor wafer, when received in the process module. When layers of the edge ring wear away due to ion bombardment, the edge of the semiconductor wafer is exposed causing the plasma sheath to roll along a contour of the semiconductor wafer edge. Consequently, the ions hitting the semiconductor wafer surface follow the contour of the plasma sheath thereby causing tilt features to be formed toward the edge of the semiconductor wafer surface. These tilt features would affect the overall yield of the semiconductor components formed on the semiconductor wafer. Further, as layers of the edge ring wear away, an underlying component, such as a chuck, for example, may get exposed to the ions, damaging the chuck surface. In order to improve the yield and to avoid damage to any underlying components, the edge ring (i.e., consumable part) needs to be replaced periodically.

The replacement station 108 mounted to the process module 118 would allow the consumable part (i.e., edge ring) to be easily replaced without breaking vacuum in the process module. In one embodiment, the replacement station 108 includes a dedicated robot that is configured to extend an end effector into the process module (e.g., process module 118) to retrieve the consumable part that needs to be replaced, and to deliver a new consumable part. A lift mechanism within the process module provides access to the consumable part. The robot of the replacement station 108 may work to place the new consumable part on a lift pin of the lift mechanism, and the lift mechanism would install the new consumable part in its position within the process module.

In one embodiment, to assist in replacing the consumable part, the replacement station is mounted to the process module (e.g., any one or each of the process modules 112-120) through a first isolation valve. A robot from the replacement station is used to access and retrieve a consumable part from the process module and move into a part buffer defined in the replacement station and provide a replacement consumable part from the part buffer. In one embodiment, the first isolation valve may be operatively connected to a controller to coordinate retrieval and replacement of the consumable part in the process module.

In addition to using the first isolation valve to mount the replacement station to the process module, the process module may be coupled to a vacuum transfer module (VTM) of the cluster tool assembly 100 using a second isolation valve. When engaged, the second isolation valve is configured to isolate the process module (112-120) from the rest of the cluster tool assembly 100 so that the replacement of the consumable part within the process module can be easily carried out without affecting operation of other process modules of the cluster tool assembly 100. Providing the second isolation valve allows the specific process module (any one of 112-120) to be taken off-line instead of the whole cluster tool assembly 100, while the remainder of the process modules (112-120) within the cluster tool assembly 100 may be allowed to continue processing the semiconductor wafer. Further, as only a specific process module (e.g., any one of 112-120) is brought off-line for replacing the consumable part(s), it would take considerably less time to restore the process module (112-120) and the cluster tool assembly 100 to a fully operational state. As a result, time taken for conditioning and qualifying operation of the cluster tool assembly 100 is much shorter. A robot of the VTM 104 may be used to move the semiconductor wafer in and out of the process module (112-120) during semiconductor wafer processing.

To allow the robot of the replacement station 108 to retrieve the consumable part from the process module (112-120), the consumable part has to be easily accessible. The process module (112-120), in one embodiment, includes a lift mechanism that provides access to the consumable part that needs to be replaced. The lift mechanism, in some embodiments, may include lift pins that can be extended to move the consumable part to a raised position. An end effector of the robot in the replacement station 108 is extended into the process module (112-120) and slid below the consumable part. The lift mechanism then retracts the lift pin leaving the consumable part to rest on the end effector of the robot. The end effector with the consumable part is then retracted from the process module (112-120) into the replacement station 108. A new consumable part is moved to the process module (112-120) using the end effector of the robot and the lift pins of the lift mechanism is extended to receive the new consumable part. The lift pins of the lift mechanism act together to align the new consumable part into position in the process module (112-120). The process of retrieving and replacing the consumable part using the lift mechanism will be discussed in more detail with reference to FIG. 4.

In some embodiments, the entire cluster tool assembly 100 may have to be brought off-line to replace the consumable part. This may occur when more than one consumable part within more than one process module (112-120) needs to be replaced, for example. Even in such embodiments, the time to bring the cluster tool assembly 100 off-line, mount the replacement station to the process module(s) (112-120), remove and replace the consumable part, condition and qualify the cluster tool assembly 100 may be much shorter as the replacement station and the process module(s) are maintained at vacuum. As a result, the process condition (i.e., vacuum) of the cluster tool assembly 100 is not adversely affected during replacement of the consumable part. Further, as the replacement is done using robot, more precise retrieval and placement of the consumable part may be engineered, thereby avoiding risk of damage to the consumable part and/or process module (112-120).

In some implementations, an opening at a side of the process module where the replacement station is mounted may be sized so that the consumable part can easily fit through the opening. Further, the opening in the process module (112-120) may be designed to minimize any asymmetry issues that may occur in the process module (112-120) and in the cluster tool assembly 100 as a whole.

The various embodiments and implementations discussed with reference to FIG. 1 allow the replacement station 108 to be mounted temporarily to the process module (112-120) when a consumable part in the process module (112-120) needs to be replaced, and retracted when the replacement of the consumable part is completed. The replacement station 108 may include a single part buffer with two distinct holding areas to receive and hold the used and new consumable parts or alternately have different part buffers for holding the used and new consumable parts separately. The robot provided in the replacement station 108 and the part buffer(s) allow delivery and retrieval of the consumable part directly to and from the process module (112-120). The isolation valves in the process module (112-120) allow bringing just the process module (112-120) offline instead of the entire cluster tool assembly 100.

Figure 2:
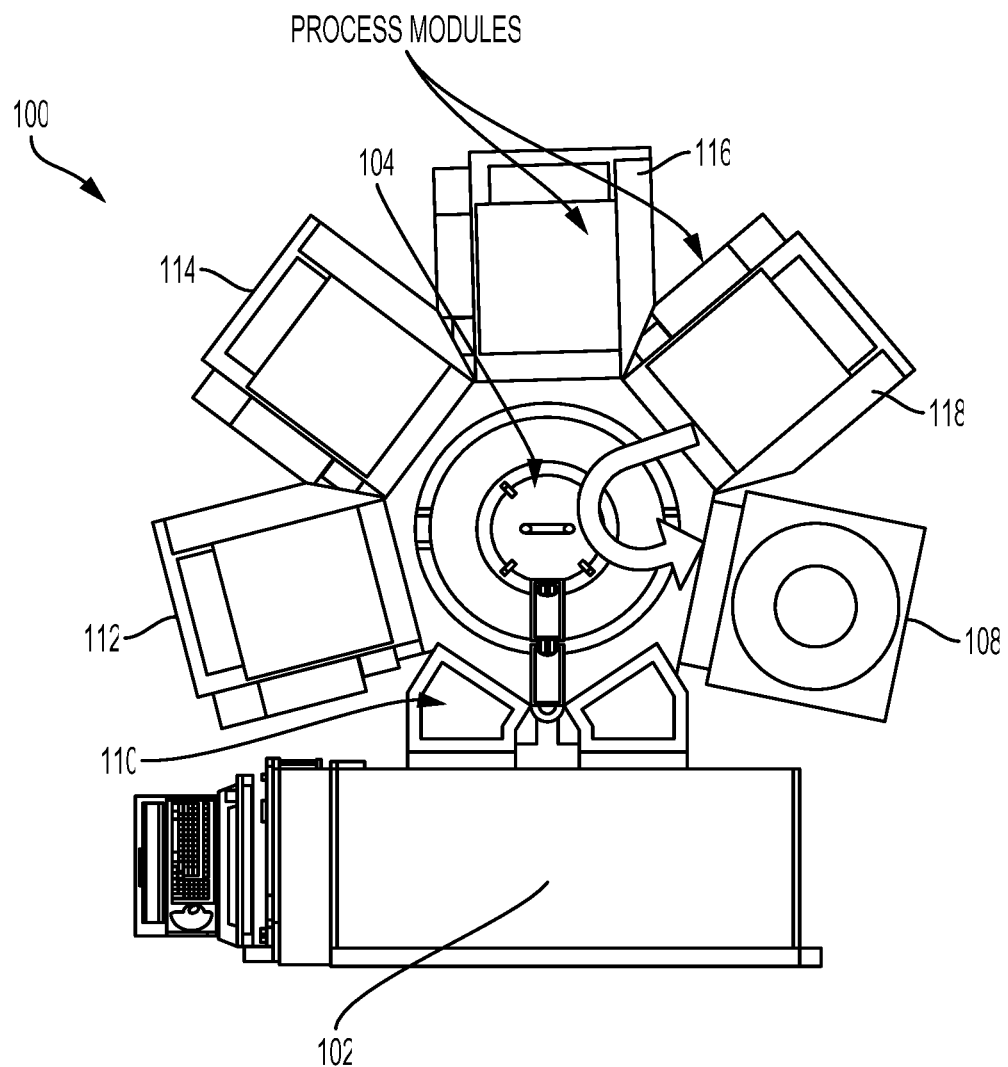
FIG. 2 illustrates a simplified block diagram of a cluster tool assembly that includes a replacement station mounted to a vacuum transfer module of the cluster tool, in an alternate embodiment of the invention.

FIG. 2 illustrates an alternate embodiment of a cluster tool assembly 100 wherein the replacement station 108 is configured to be mounted to a vacuum transfer module (VTM) 104 disposed in the cluster tool assembly 100 instead of the process module (112-118). The VTM 104 includes a robot that is used, during processing of the semiconductor wafer, to move a semiconductor wafer from a loadlock chamber 110 to a process module 112-118, and into and out of one or more process modules 112-118 integrated with the VTM 104. The robot includes an end effector that is used to receive, hold and move the semiconductor wafer between the different process modules. A separate opening is defined in the VTM 104 to allow the replacement station 108 to be mounted such that the replacement station 108 aligns with the opening defined in the VTM 104. Where symmetry is important, the opening in the VTM 104 is defined to preserve the uniformity and symmetry of the VTM 104, and of the cluster tool assembly 100. For example, a dummy opening with a dummy door may be defined in the VTM 104 opposite to the opening, to maintain the uniformity and symmetry at the VTM 104. Alternately, if a dummy opening is already present in the VTM 104 and the opening is large enough to move the consumable part, the replacement station 108 may be mounted to the dummy opening so as to continue to maintain the uniformity and symmetry in the cluster tool assembly 100.

Typically, the opening in the VTM 104 is sized to fit the semiconductor wafer and a carrier/robot that are used to move the semiconductor wafer in to and out of the VTM 104. However, a consumable part that is larger than the semiconductor wafer may not fit through. For example, an edge ring disposed to surround the semiconductor wafer when received in the process module (112-118), is wider than the semiconductor wafer. In such cases, the edge ring as a whole may not be able to fit through the opening that was designed to move the semiconductor wafer, without re-engineering the opening. In some cases, re-engineering the opening of the VTM 104 may not be a viable option as it may affect symmetry of the cluster tool assembly. Therefore, instead of re-engineering the opening of the VTM 104 and causing asymmetry in the cluster tool assembly 100, a segmented consumable part may be used so that each segment may fit through the opening. For example, the edge ring that is used to surround the semiconductor wafer in the process module may be designed as a segmented edge ring made up of two or more parts with each part designed to fit through the opening of the VTM 104 and the replacement station 108. In this example, the segmented edge ring may be individually extracted and replaced.

When replacing the consumable part, especially a multi-part segmented consumable part, each segment of the consumable part has to be properly aligned and set within the process module so that no gap is defined between the segments. It should be noted that in process operations, such as a high-aspect ratio etching operation, a gap present between any components of a etch process module would cause the ion to flow through and damage any underlying component. For example, a gap in an edge ring in a high aspect etcher module would cause the high-energy ion to flow through to an underlying chuck on which the edge ring may be disposed, damaging the surface of the chuck. To prevent the gap from forming, the segmented consumable part may be designed to ensure that each segment fits tightly with other segment when installed in the process module. Accordingly, in some implementations, the segmented or multi-part consumable part may be designed to have interlocking segments. Alternately, the consumable part may be designed to have overlapping segments so as to prevent the ion or processing gas/chemistry from finding a direct flow path to the underlying component. For example, in some implementations, the consumable part may be made of an inner part and an outer part that can either wholly or segmentally fit through the opening defined between the VTM 104 and the replacement station, and installed in the process module with one part overlapping over the other part, thereby preventing gap from forming. Other variations in design of the consumable part may be implemented to enable the consumable part to be moved into and out of the VTM 104 without having to re-engineer the opening that is designed to maintain symmetry in the cluster tool assembly.

In one embodiment, instead of using a dedicated robot in the replacement station 108, a robot used in the VTM 104 to move the semiconductor wafer into and out of the process module, may also be used in the retrieval and replacement of the consumable part. In some implementations, an end effector of the robot that is used to move the semiconductor wafer between the process modules is also used to receive, hold and move the consumable part between the process module 112-118 and the replacement station 108. In other implementations, the robot of the VTM 104 is designed to have different end effectors for moving the consumable part and the semiconductor wafer. An end effector is a part that is usually defined in a robot for retrieving, supporting, holding, picking, lifting, moving, or rotating a moveable part, such as a semiconductor wafer or a consumable part. The moveable part may be held in any orientation plane. Separate end effectors may be provided to separately move the consumable part and the semiconductor wafer so as to prevent contamination of the semiconductor wafer.

In an alternate embodiment, a dedicated robot in the replacement station 108 may work with the robot of the VTM 104 to extract and replace the consumable part in a process module. For example, the robot of the VTM 104 may be used to extract the used consumable part from the process module and move it to a staging area defined between the VTM 104 and the replacement station 108. The dedicated robot of the replacement station 108 may be used to move the used consumable part from the staging area into a part buffer. Similarly, the dedicated robot of the replacement station 108 may be used to move a new consumable part from the part buffer of the replacement station 108 into the staging area and the robot of the VTM 104 may be used to move the new consumable part from the staging area to the process module. In one embodiment, the staging area may have a first area for receiving the used consumable part and a second area for receiving the new consumable part. The lift mechanism in the process module (112-118) is used to install the new consumable part in the process module (112-118).

The design of the replacement station 108 in the embodiment illustrated in FIG. 2 is similar to the design of the replacement station 108 discussed with reference to FIG. 1. For example, the replacement station 108 of FIG. 2 includes a mechanism, such as a pump, to maintain the replacement station 108 at vacuum when the replacement station 108 is mounted to the VTM 104. Maintaining the process condition of the replacement station 108 similar to the VTM 104 (i.e., at vacuum) would ensure that the process condition within the VTM 104 is not adversely affected during replacement of the consumable part. One or more part buffers are defined in the replacement station 108 to receive and hold the used and new consumable parts.

The design of the process module (118) illustrated in FIG. 2 is slightly different from the process module (118) defined in FIG. 1. In that, the process module illustrated in FIG. 2 does not include a second opening. For example, as the replacement station 108 is being mounted directly to the VTM 104 and access to the process module (118) from the replacement station 108 is provided through the VTM 104, the process module (118) does not require a second opening for mounting the replacement station 108. Additionally, a single isolation valve is used to provide access to the process module (118) through the VTM 104 during replacement of the consumable part and for isolating the process module during processing of semiconductor wafer. It should be noted that the replacement station 108 is maintained at vacuum so that the consumable part may be easily replaced without adversely affecting the process condition in the cluster tool assembly 100. Consequently, the conditioning and qualifying of the cluster tool assembly 100 to process the semiconductor wafer may be accomplished in a shorter time as the purge/pump process is not required and the other qualifying steps are performed in a shorter time. The replacement station 108, in some implementations, may be permanently mounted to the VTM 104.

Figure 3:
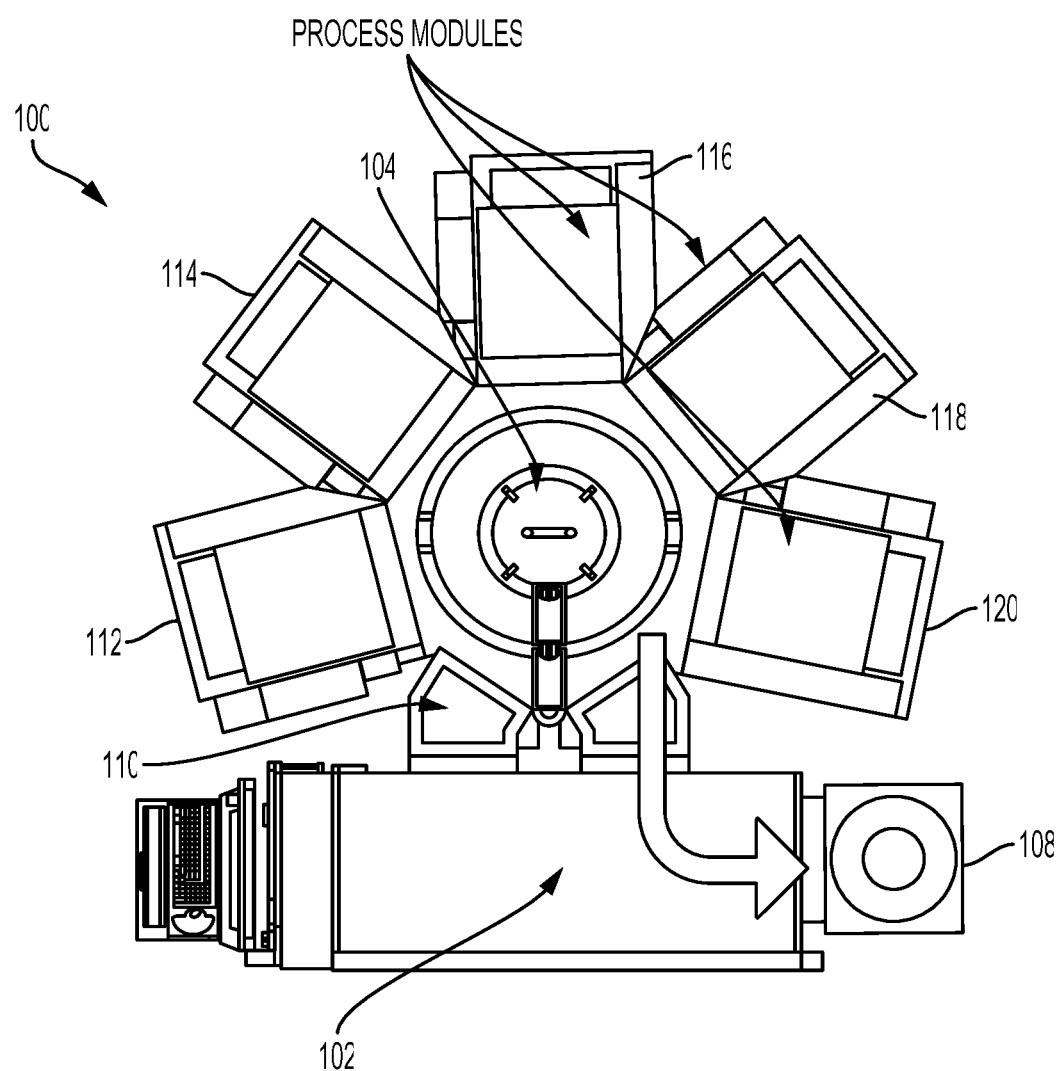
FIG. 3 illustrates a simplified block diagram of a cluster tool assembly that includes a replacement station mounted to an atmospheric transfer module of the cluster tool, in an alternate embodiment of the invention.

FIG. 3 illustrates another embodiment of a cluster tool assembly 100 wherein the replacement station 108 is mounted to an atmospheric transfer module (ATM) 102. A robot in the ATM 102 of the cluster tool assembly 100 used to move the semiconductor wafer from a loader, for example, to a loadlock chamber 110 is also used to move the consumable part to and from the replacement station 108. In this embodiment, the replacement station 108 mounted to the ATM 102 is maintained at same atmospheric condition as the ATM 102. Consequently, the replacement station 108 does not need a pump or similar mechanism to maintain the replacement station 108 at vacuum. In some implementations, the replacement station 108 may be permanently mounted to the ATM 102.

In addition to the ATM 102, the cluster tool assembly 100 illustrated in FIG. 3 includes a vacuum transfer module (VTM) 104 and a plurality of process modules 112-120 integrated with the VTM 104. A loadlock chamber 110 is defined between the ATM 102 and the VTM 104 and acts as an interface to move the semiconductor wafer from ATM 102 to the VTM 104, while preserving process conditions in the ATM 102 and VTM 104.

The loadlock chamber 110 of the cluster tool assembly 100 is designed to handle both the semiconductor wafer and the consumable part. Separate staging areas, such as compartments, may be provided in the loadlock chamber 110 for receiving the semiconductor wafer and the consumable part in order to avoid contaminating the semiconductor wafer. The staging area in the loadlock chamber 110 designed for receiving the consumable part may be further configured to provide separating staging areas for receiving the used consumable part and the new consumable part. An opening defined in the loadlock chamber 110 is designed to fit the consumable part and the semiconductor wafer. Alternately, when the opening is not designed to fit the consumable part, a segmented consumable part may be used so that each segment of the consumable part may fit through the opening defined in the loadlock chamber 110.

In the embodiment illustrated in FIG. 3, a robot in the VTM 104 used to move the semiconductor wafer from the loadlock chamber 110 to a process module (112-120) that is integrated into the VTM 104 or from one process module (112-120) to another, is also used to move the consumable part between the loadlock chamber 110 and the process module (112-120).

In some implementations, in addition to the robot s of the ATM 102 and the VTM 104, the replacement station 108, may include a dedicated robot that is configured to move the consumable part between a part buffer of the replacement station and the ATM 102. In such embodiments, the robot of the ATM 102 may be used to move the consumable part and the semiconductor wafer between the ATM 102 and the loadlock chamber 110, and the robot of the VTM 104 may be used to move the consumable part and the semiconductor wafer between the loadlock chamber 110 and the process module (112-120). In one implementation, a single end effector may be provided in the robots of the ATM 102 and VTM 104 that may be engaged at different times to move both the semiconductor wafer and the consumable part. In another embodiment, separate end effectors may be provided in the robots of the ATM 102 and the VTM 104, one for moving the semiconductor wafer and another for moving the consumable part. A lift mechanism is used to properly align and install the new consumable part at appropriate location within the process module (112-120).

Replacing a consumable part in a process module integrated in a cluster tool assembly requires access to the process module and to the consumable part within the process module. The access to the process module has been discussed with reference to FIGS. 1-3 wherein a replacement station 108 is mounted directly to a process module (112-120), or to a vacuum transfer module 104 or to an atmospheric transfer module 102 through which access is provided to the process module (112-118, 120). Once the process module (112-118, 120) is accessed, access to the consumable part needs to be provided so that the consumable part can be safely retrieved and replaced without damaging the consumable part or other hardware components of the process module (112-120).

Figure 4:
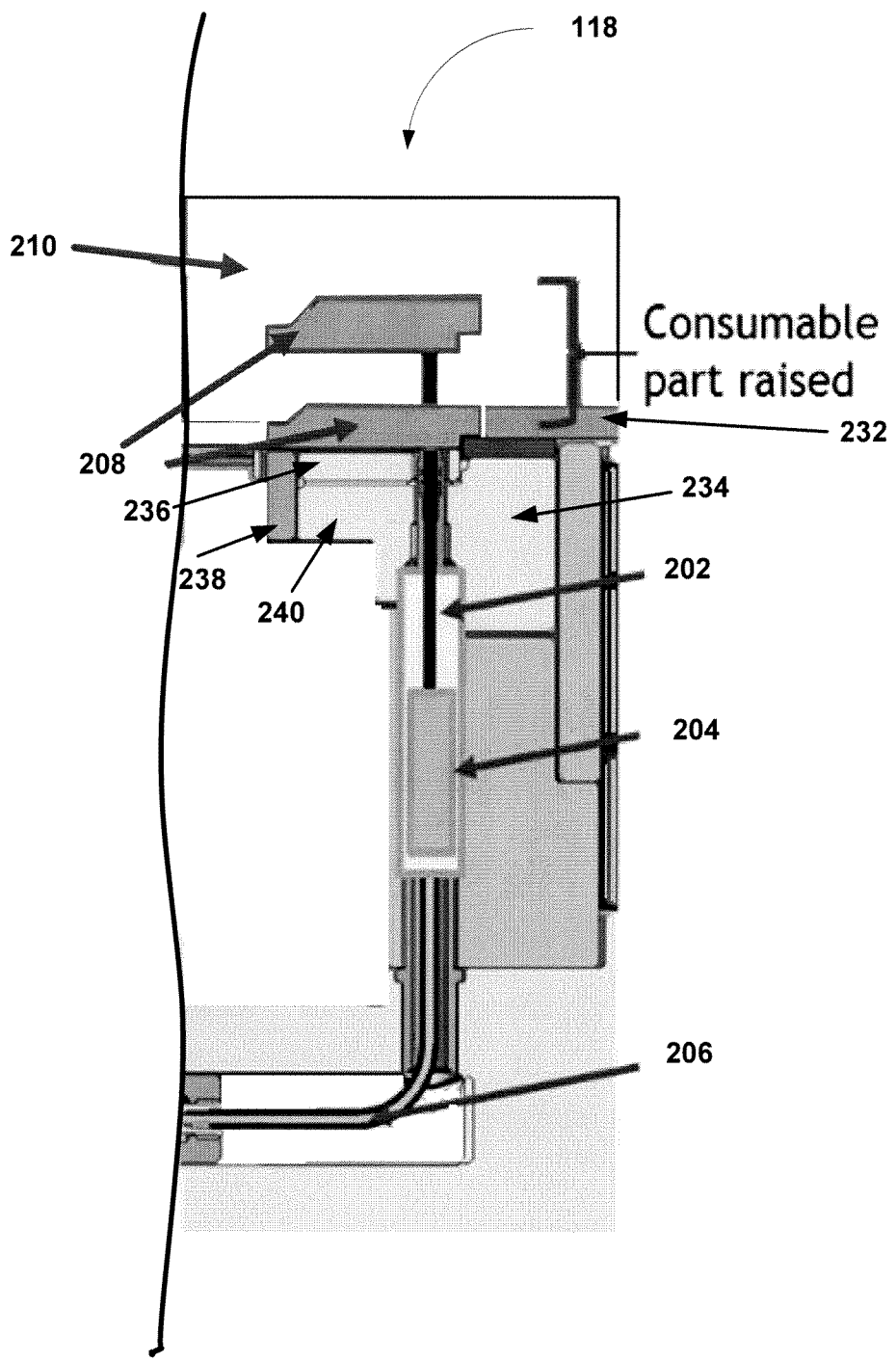
FIG. 4 illustrates a simplified block diagram of a portion of a process module of a cluster tool assembly that includes an example lift mechanism used to provide access to a consumable part, in one embodiment of the invention.

FIG. 4 illustrates an example embodiment of a lift mechanism that may be used within a process module (112-120) of a cluster tool assembly 100 to provide access to a consumable part 208 that needs to be replaced. In some implementations, the consumable part 208 is disposed over a bottom edge ring 236, and adjacent to a cover ring 232. The bottom edge ring 236 is disposed over a base ring 240 and, in some implementations, next to a sleeve ring 238. The lift mechanism is configured to move the consumable part 208 to a raised position so that the consumable part 208 can be accessed. In some implementation, the consumable part 208 is an edge ring that is disposed adjacent to a semiconductor wafer 150 that is received in the process module during processing. The lift mechanism includes a plurality of lift pins 202 that are connected to a plurality of actuators 204. For example, the lift pins may be distributed along a plane to allow the lift pins to contact the consumable part at different points and move the consumable part. In some implementations, the lift pins distributed in a plane may be grouped into distinct sets, with each set of lift pins being operated independently to access and lift different consumable parts. In some implementations, the actuators 204 are vacuum-sealed actuators 204 that are outfitted with plurality of lift pins 202.

The actuators 204 are driven by an actuator drive 206. In a disengaged mode, the lift pins 202 stay retracted inside a housing defined in the lift mechanism and is not in contact with the consumable part 208. When the consumable part 208 needs to be replaced, the actuator 204 is powered through the actuator drive 206. The powered actuator 204 causes the lift pins 202 to extend outside of the housing so as to come in contact with the consumable part 208 and move the consumable part 208 to a raised position. As the process module (e.g., 118) is maintained in a vacuum state, when the consumable part is raised, the consumable part is raised into the vacuum space 210. A robot of either the VTM 104 or the replacement station 108 extends an end effector into the process module 118 and allows it to slide underneath the raised consumable part 208. In some embodiments, the end effector attached to the robot is shaped like a spatula allowing the end effector to support the raised consumable part. Once the end effector has slid into place, the actuators 204 retract the lift pins 202 into the housing, causing the consumable part 208 to rest on the end effector. The robot is then manipulated to pull the end effector back into either the VTM 104 or the replacement station 108, depending on which robot is used to retrieve the consumable part 208, bringing the consumable part 208 with it. A reverse order occurs when a new consumable part 208 needs to be placed in the process module (e.g., 118). The lift mechanism of the process module (e.g., 118) is used to properly install the consumable part in an appropriate location in the process module (118) so that the process module (118) and the cluster tool assembly 100 is operational.

In addition to providing power to the actuators to operate the lift pins to raise the consumable part 208, a power source connected to the actuator drive 206 of the lift mechanism, in some implementations, may supply power to the consumable part through the lift pins. The actuators 204 and the lift pins 202, in such implementations, may be made of conductive material so as to supply power to the consumable part 208. In some implementations, a surface area of the lift pin that comes in contact with the consumable part may act as an electrical contact and be used to supply the power to the consumable part from a power source. In some implementations, the power source is a radio frequency (RF) power source so as to allow the lift pins 202 to supply RF power to the consumable part 208. Additional details of powering the consumable part using RF power source are described in co-owned and co-pending U. S. Provisional Patent Application No. 62/191,817, filed on Jul. 13, 2015, and entitled "Extreme Edge Sheath and Wafer Profile Tuning Through Edge-Localized Ion Trajectory Control and Plasma Operation," which is incorporated herein by reference in its entirety. In some implementations, the lift pins 202 may be switched. The switch may be used to control amount of power supplied to the consumable part 208. In some implementations, the switch may be used to supply different power to the consumable part 208. In some implementations, the power supplied to the consumable part 208 may be used to heat the consumable part 208. For example, when the consumable part 208 is an edge ring, the power supplied by the power source may be used to provide a temperature controlled edge ring. In some implementations, the consumable part 208 may be powered through other means, such as through capacitive coupling. Additional details for powering consumable part 208, such as edge ring, using alternate means, such as capacitive coupling are described in co-owned and co-pending U.S. Provisional Patent Application No. 62/206,753, filed on Aug. 18, 2015, and entitled "Edge Ring Assembly for Improving Feature Profile Tilting at Extreme Edge of Wafer," which is incorporated herein by reference. It should be noted that the different means for powering a consumable part 208 discussed herein are mere examples and other forms of powering the edge ring may also be employed. In some implementations, the consumable part 208 (single piece or different pieces of a multi-piece consumable part) may be aligned and installed into position in the process module (e.g., 118) using one or more magnets. For example, the lift mechanism provided in the process module (e.g., 118) may include a surface on which the consumable part 208 is supported. One or more magnets may be disposed on an underside of the surface of the lift mechanism on which the consumable part 208 is supported. The magnets disposed in the lift mechanism may be used to align the consumable part into position within the process module (e.g., 118).

In some implementations, the lift mechanism may be connected to an air compressor or other compressed pressure source to allow the lift mechanism to be operated pneumatically. In some implementations, the lift mechanism may be used to provide electrostatic clamping to clamp the consumable part 208 in position within the process module (e.g., 118). In these implementations, the lift mechanism may be connected to a direct current (DC) power source to allow the lift pins 202 to provide the DC power to clamp the consumable part 208 in position within the process module (e.g., 118).

Figure 5A:
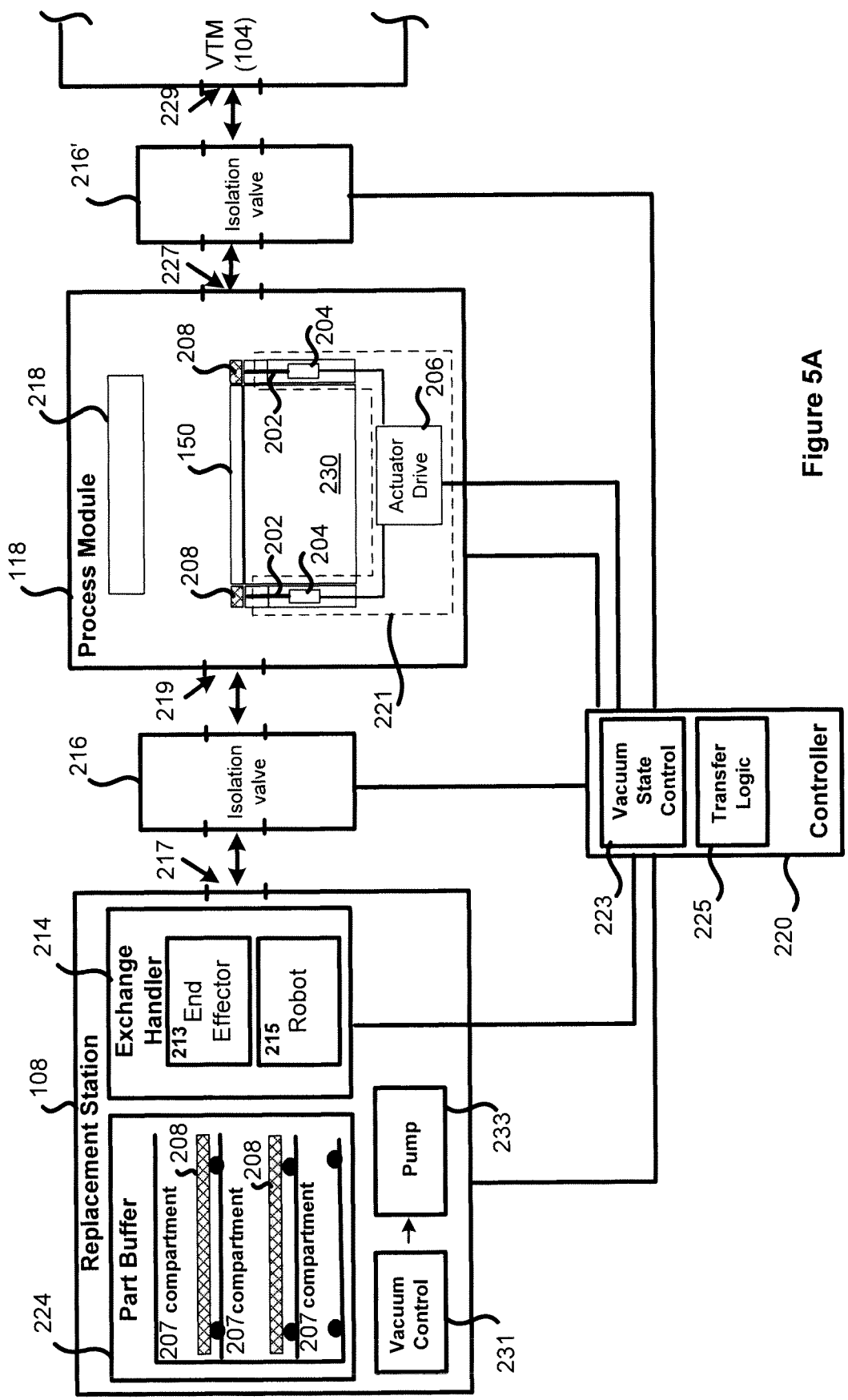
FIG. 5A illustrates a simplified block diagram of a process module with a replacement station mounted for moving a consumable part, wherein a lift mechanism is in a disengaged mode, in one embodiment of the invention.

FIG. 5A illustrates an example cluster tool assembly identifying various components that are used for replacing a consumable part within a process module 118, in one embodiment. The process module 118 may be an etcher module that can be used to generate a transformer coupled plasma (TCP) for performing conductive etching, or a capacitively coupled plasma (CCP) for conducting dielectric etching, or used to perform a plasma enhanced chemical vapor deposition (PECVD) or an atomic layer deposition (ALD), or any other type of etching on a semiconductor wafer. Alternately, the process module 118 may be used to perform any other process operation (e.g., deposition, plating, etc.) to define different features on the semiconductor wafer.

The replacement station 108 may include a part buffer 224. The part buffer 224, in one embodiment, includes a plurality of compartments 207 that are configured to receive used consumable part 208 retrieved from a process module and new consumable part 208 that need to be delivered to the process module. Alternately, separate part buffers 224 may be used to distinctly store used consumable parts 208 and new consumable parts 208. An exchange handler 214 within the replacement station 108 may be used to move the new consumable part 208 from a compartment 207 of the part buffer 224 into the process module 118 and retrieve used consumable part 208 from the process module 118 and store in compartment 207 of the part buffer 224. The exchange handler 214 includes a robot 215 that is configured to move laterally, vertically and/or radially to allow an end effector 213 of the exchange handler 214 to access the consumable part 208 in the part buffer 224 and the process module 118. The end effector may be configured to access, retrieve and deliver the consumable part 208 to the part buffer 224 or the process module. In some implementations, the end effector may be a special end effector that is designed to retrieve, pick, lift, support, hold, move, or rotate the consumable part in any plane. The end effector of the exchange handler 214 may be manipulated to extend and contract during operation so that the consumable part may be retrieved from a process module and stored in the part buffer 224. In some implementations, the end effector may be configured to move radially, laterally and/or vertically to provide greater flexibility during retrieval operation. The exchange handler 214 is connected to a controller 220 to control movement of the robot 215 and the end effector 213 of the exchange handler 214.

The replacement station 108 may also include a vacuum control module 231 that is connected to a pump 233 so as to manipulate the process condition in the replacement station 108. In some implementations, the replacement station 108 is connected to the controller 220 to enable coordinating operation of the pump 233 through the vacuum control module 231 during replacement of the consumable part.

A first isolation valve 216 is provided between the replacement station 108 and the process module 118 to allow the replacement station 108 to be mounted to the process module 118. In some implementation, the first isolation valve 216 may be a gate valve. The process module 118 includes a first side and a second side, with the first side of the process module 118 coupled to a vacuum transfer module (VTM) 104, and a second side of the process module 118 coupled to a first side of the first isolation valve 216. A second side of the first isolation valve 216 is coupled to a replacement station 108. The coupling manipulates the doors 217, 219, for example, defined in the replacement station 108 and the process module 118, respectively, so as to allow a robot 215 in the replacement station 108 to access the process module 118. A first side of a second isolation valve 216' is coupled to the VTM 104 and a second side of the second isolation valve 216' is coupled to the first side of the process module 118. The coupling allows manipulation of the doors 227, 229 that cover corresponding openings defined in the process module 118 and the VTM 104, respectively, so as to allow a robot in the VTM 104 to access the process module 118 and move the semiconductor wafer into and out of the process module 118, during processing. The first isolation valve 216 and the second isolation valve 216' are connected to the controller 220 to coordinate coupling of the process module 118 to the VTM 104 and the replacement station 108.

The process module 118 includes an upper electrode 218 that may be used to provide process chemistry to a process region defined in the process module 118. The upper electrode 218 may be connected to a power source (not shown) to provide power to the process chemistry in the process region so as to generate plasma, for example. In some embodiments, the power source may be a RF power source that is connected to the upper electrode 218 through a match network (not shown). Alternately, the upper electrode may be electrically grounded.

The process module 118 also includes a lower electrode 230. The lower electrode 230 is, in some implementations, configured to receive a semiconductor wafer 150 for processing. In some implementations, the lower electrode 230 is an electrostatic chuck. The lower electrode 230 may be coupled to a power source (not shown) to provide power to the lower electrode 230 during processing. Alternately, the lower electrode 230 may be electrically grounded.

The process module 118 includes a lift mechanism 221 to enable the consumable part 208 to be moved to a raised position. The lift mechanism 221 is similar to the lift mechanism discussed with reference to FIG. 4 and includes a plurality of lift pins 202 and actuators 204 to lift the consumable part to a raised position, and an actuator drive 206 connected to the actuators 204 to provide the power to drive the actuator 204. The actuator 206 may be coupled to the controller 220 to control operation of the lift mechanism 221 during replacement of the consumable part.

The controller 220 includes a vacuum state control 223 and a transfer logic 225 to facilitate coordinating operation of the various components that are connected to the controller 220. In one implementation, when a consumable part is to be replaced in the process module 118, the replacement station 108 is brought in contact with the first isolation valve 216. In response to detecting the replacement station 108 at the first isolation valve 216, a signal is sent from the isolation valve 216 to the controller 220. The controller 220 then coordinates the coupling of the replacement station 108 to the process module 118 and maintaining vacuum at the replacement station 108. For example, in response to the detection signal received from the first isolation valve 216, the vacuum state control 223 of the controller 220 may send a signal to the vacuum control 231 to begin the process of coupling the replacement station 108 to the process module 118. In response to the signal received from the vacuum state control 223, the vacuum control 231 may activate the pump 233 to allow the pump 223 to bring the replacement station to a vacuum state. Once the replacement station 108 has reached a vacuum state, a signal is sent from the vacuum control 231 to the vacuum state control 223. The vacuum state control 223 then sends a signal to the first isolation valve 216 to couple the replacement station to the process module 118. The first isolation valve 216, in response, ensures any intermediate region of the first isolation valve 216 between the replacement station 108 and the process module 118 is maintained in a vacuum state. Upon ensuring, the first isolation valve 216 performs the coupling of the process module 118 to a first side of the first isolation valve 216 and the replacement station 108 to a second side of the first isolation valve 216. Further testing may be done to ensure the replacement station 108 and intermediate areas of the first isolation valve 216 are at vacuum before manipulating the doors 217, 219 to provide access to the process module 118.

As part of the coupling operation, the vacuum state control 223 may coordinate operation of a second isolation valve 216' so as to keep the doors 227, 229 covering corresponding openings defined in the process module 118 and the VTM 104 to which the process module 118 is integrated, closed and sealed. During the coupling, the lift mechanism 221 in the process module 118 is kept in a disengaged mode with the lift pins 202 retracted into a housing of the lift mechanism 221 and the consumable part 208 resting in its installed position. For example, the consumable part 208 is an edge ring. In its installed position, the edge ring is positioned adjacent to and substantially surrounding a semiconductor wafer 150, when the semiconductor wafer 150 is present in the process module 118.

Once the process of coupling is completed, a signal is sent from the first isolation valve 216 and, in some embodiments, from the second isolation valve 216', to the controller 220. In response, the controller 220 activates a transfer logic 225. The transfer logic 225 is configured to coordinate movement of the robot 215, the end effector 213 of the exchange handler 214 within the replacement station 108 and the actuator drive 206 of the lift mechanism 221 in the process module 118 to allow the end effector 213 to retrieve the consumable part from the process module 118 and move to a compartment 207 in a part buffer 224 defined in the replacement station 108 and to move a replacement for the consumable part from a compartment 207 of the part buffer 224 back to the process module 118 for installation. The lift mechanism 221 is manipulated to install the replacement consumable part into an appropriate location in the process module 118.

Figure 5B:
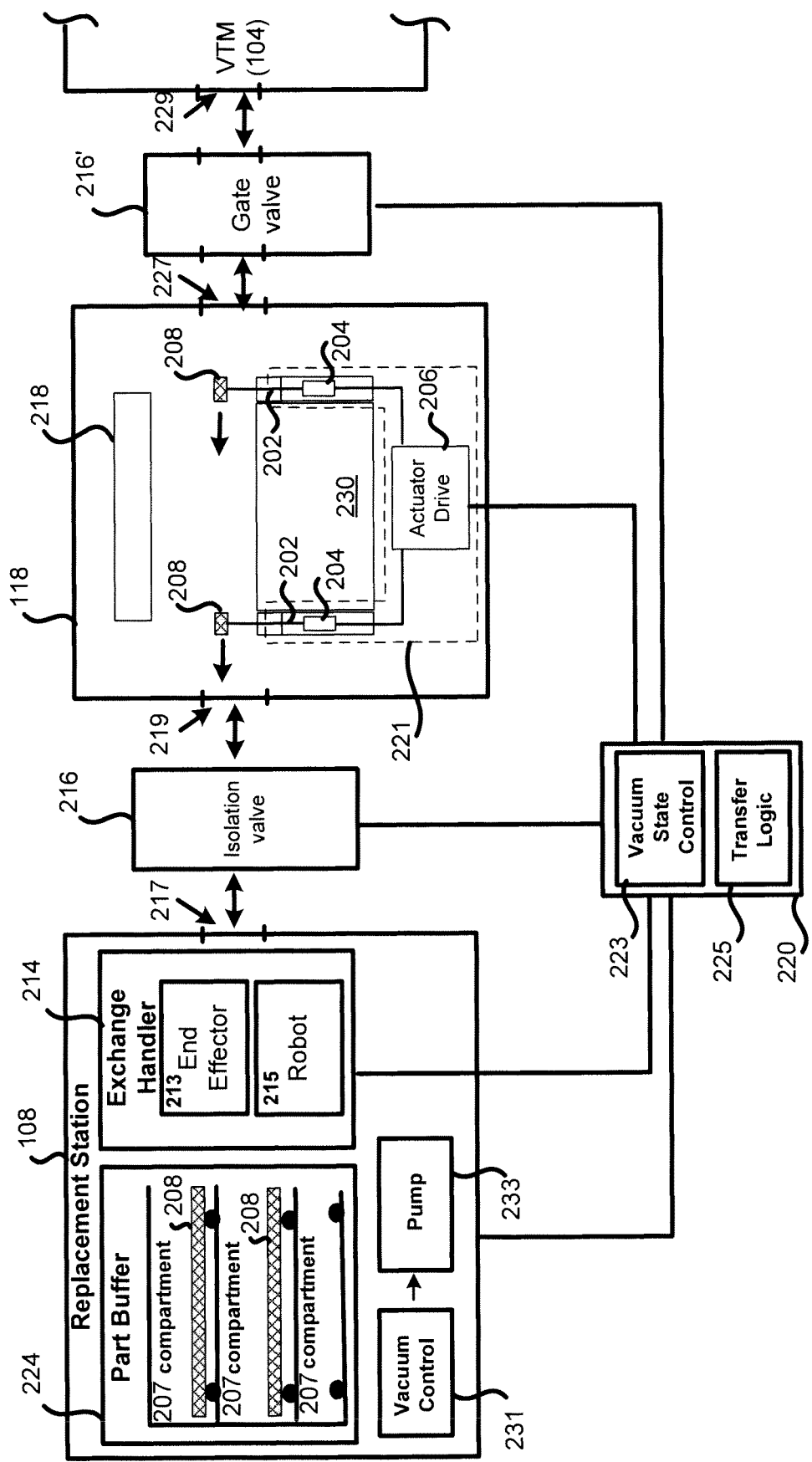
FIG. 5B illustrates a simplified block diagram of a process module with a replacement station mounted, wherein a lift mechanism is in an engaged mode, in one embodiment of the invention.

FIG. 5B illustrates the process followed to retrieve the consumable part 208 from the process module 118, in one embodiment. The consumable part 208 is usually replaced before a semiconductor wafer is received in the process module 118 for processing. In accordance to this embodiment, once the replacement station 108 is coupled to the process module 118 through the first isolation valve 216 and the second isolation valve 216' seals the doors 227, 229 to VTM 104, the transfer logic 225 of the controller 220 is used to send signals to the exchange handler 214 and to the actuator drive 206 to retrieve the consumable part from the process module and replace with a new consumable part. The transfer logic 225 sends signals to manipulate the robot 215 and the end effector 213 to allow the end effector 213 to extend into the process module 118 to retrieve the consumable part. At the same time, the transfer logic 225 manipulates the actuator drive 206 to cause the actuators 204 to move the lift pins 202 out of a housing defined in the lift mechanism 221, thereby moving the consumable part 208 from an installed position to a raised position, as illustrated in FIG. 5B. The end effector 213 slides below the raised consumable part 208 substantially supporting it. The actuator drive 206 is then manipulated to cause the actuators 204 to retract the lift pins 202 into the housing in the lift mechanism 221 allowing the raised consumable part 208 to rest on the end effector 213 of the exchange handler 214. The end effector 213 of the exchange handler 214 is then manipulated to retract into the replacement station 108 bringing the consumable part 208 with it. The end effector 213 is then manipulated to move the retrieved consumable part 208 to a compartment 207 of the part buffer 224.

A new consumable part 208 is moved from a different compartment 207 of the part buffer 224 to the process module 118 in a similar manner. When the new consumable part 208 is moved into the process module 118, the actuator drive 206 is manipulated to cause the actuators 204 to extend the lift pins 202 out of the housing so as to receive the new consumable part 208. The actuators 204 allow the lift pins 202 to be lowered so that the consumable part 208 is set in an installed position in the process module 118. During the replacement of the consumable part, the vacuum state control 223 continually interacts with the vacuum control 231 to ensure that the pump 233 continues to keep the replacement station in a vacuum state so as to match the vacuum state maintained in the process module 118.

Once the consumable part 208 is replaced, the controller 220 is used to coordinate the withdrawal of the replacement station 108 from the process module 118. In accordance to this, the controller 220 sends a signal to the first isolation valve 216 to close the doors 217, 219 between the process module 118 and the replacement station 108, and a signal to the second isolation valve 216' to unlock the doors 227, 229 so as to allow the VTM 104 to access the process module 118.

In some implementations, the process module 118 may be conditioned before returning the process module to active operation. The conditioning operation may take a shorter time as the replacement of the consumable part was carried out in vacuum and only the process module 118 needs to be conditioned. A signal may then be sent from the vacuum state control 223 to the vacuum control 231 to allow the pump 233 to purge the replacement station 108. The replacement station 108 may then be dismounted from the process module 118.

Figure 5C:
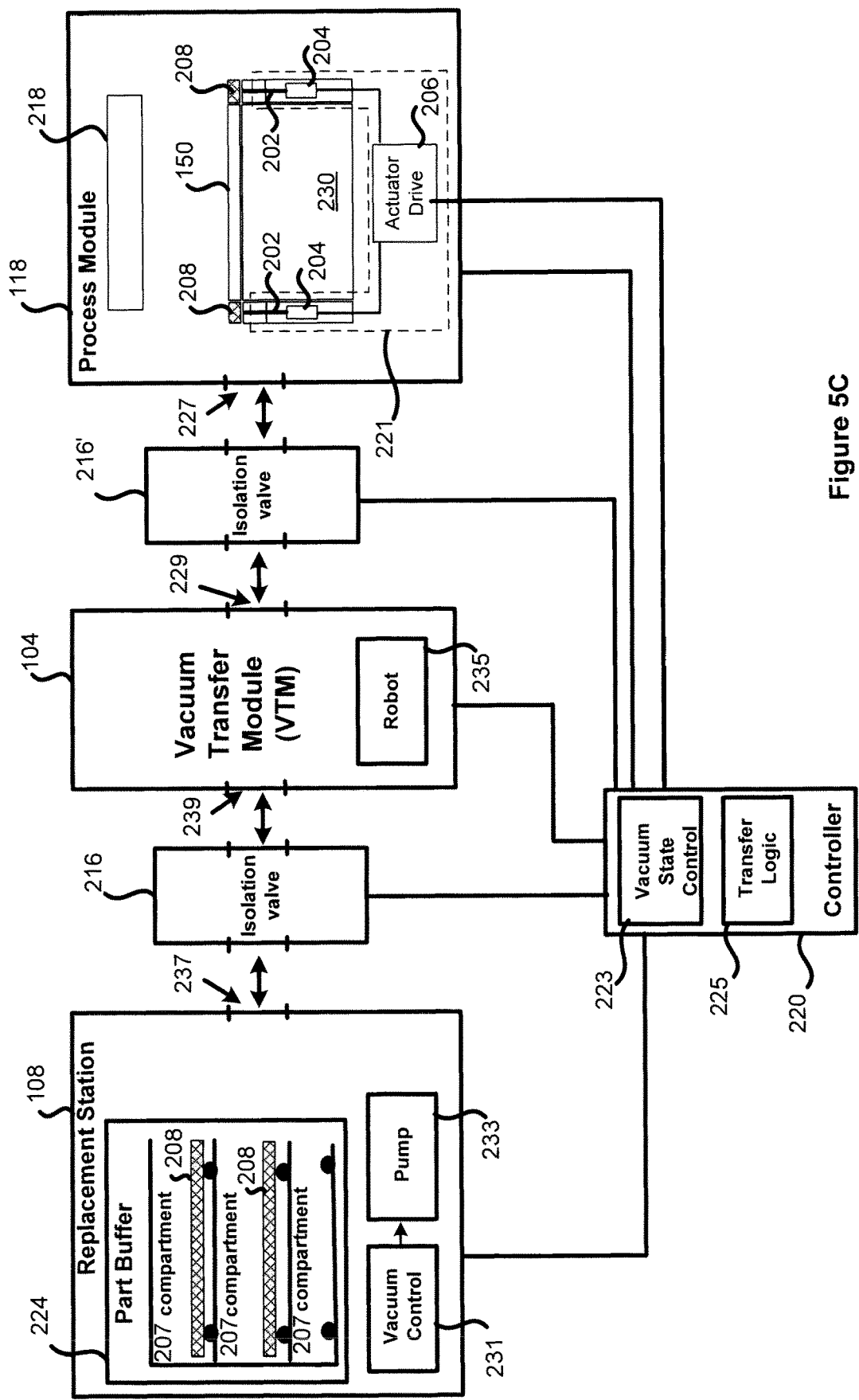
FIG. 5C illustrates a simplified block diagram of a process module with a replacement station mounted to a vacuum transfer module and a lift mechanism in the process module used in replacing the consumable part within the process module, in one embodiment of the invention.

FIG. 5C illustrates the process followed for replacing a consumable part within an embodiment of cluster tool assembly illustrated in FIG. 2, wherein the replacement station 108 is mounted to a VTM 104 instead of the process module 118. In this embodiment, the replacement station 108 is mounted to a vacuum transfer module (VTM) 104 through a first isolation valve 216, such that a first side of the first isolation valve 216 is coupled to a first side of the VTM 104. A replacement station 108 is coupled to the second side of the first isolation valve 216. A second isolation valve 216' is disposed such that a first side of the second isolation valve 216' is coupled to a process module 118 and a second side of the second isolation valve 216' is coupled to the second side of the VTM 104. The first isolation valve 216 is configured to manipulate doors 237, 239 that cover corresponding openings defined in the replacement station 108 and the VTM 104, respectively, and the second isolation valve 216' is configured to manipulate doors 227, 229, that cover corresponding openings defined in the VTM 104 and the process module 118, respectively, so as to allow a robot in the VTM 104 to access, retrieve and move the consumable part between the process module 118 and a compartment 207 in a part buffer 224 in the replacement station 108. The replacement station 108 illustrated in FIG. 5C does not include a dedicated exchange handler 214 with robot 215 and end effector 213. The robot 235 is operatively coupled to the controller 220 so as to allow the controller to coordinate operation of the robot 235. Further, the replacement station, the first isolation valve 216, the VTM 104, the second isolation valve 216' and the process module 118 are coupled to the controller 220 so as to synchronize access between the replacement station and the process module during replacement of the consumable part while the process module 118, the VTM 104 and the replacement station 108 are kept at a vacuum state.

The process of mounting the replacement station 108 to the VTM 104 is similar to the embodiment discussed with reference to FIG. 5A except that the replacement station 108 is mounted to the VTM 104 instead of the process module 118. The process of replacing the consumable part 208 is similar to the embodiment discussed with reference to FIG. 5A except the controller 220 coordinates with the robot 235 of the VTM 104 instead of coordinating with the robot 215, end effector 213 of the replacement station 108 discussed in FIG. 5A.

In an alternate embodiment, the replacement station 108 may include an exchange handler 214 (not shown) with a robot 215 and end effector 213, wherein the exchange handler 214 is operatively connected to the controller 220. The controller 220 is used to control coordination of the robot 215, the end effector 213, and the robot 235 during replacement of the consumable part. In this embodiment, the robot 215 and the end effector 213 may be used to retrieve and move the consumable part between the part buffer 224 and the VTM 104, and the robot 235 of the VTM 104 may be used to move the consumable part between the VTM 104 and the process module 108.

It should be noted that in the embodiment illustrated in FIG. 5C, the second isolation valve 216' is not used to isolate the process module 118 from the rest of the cluster tool assembly 100 during replacement of the consumable part. This is due to the fact that the access to the process module, in this embodiment, is provided through the VTM 104. As a result, second isolation valve 216' is configured to provide access when the consumable part needs to be replaced, while enabling selective isolation of the process module 118 during the processing of a semiconductor wafer. The conditioning of the cluster tool assembly 100 after replacement of the consumable part, in this embodiment, will take shorter time as the replacement station, the VTM 104 and the process module 118 are all maintained in a vacuum state during the replacement of the consumable part.

Figure 6:
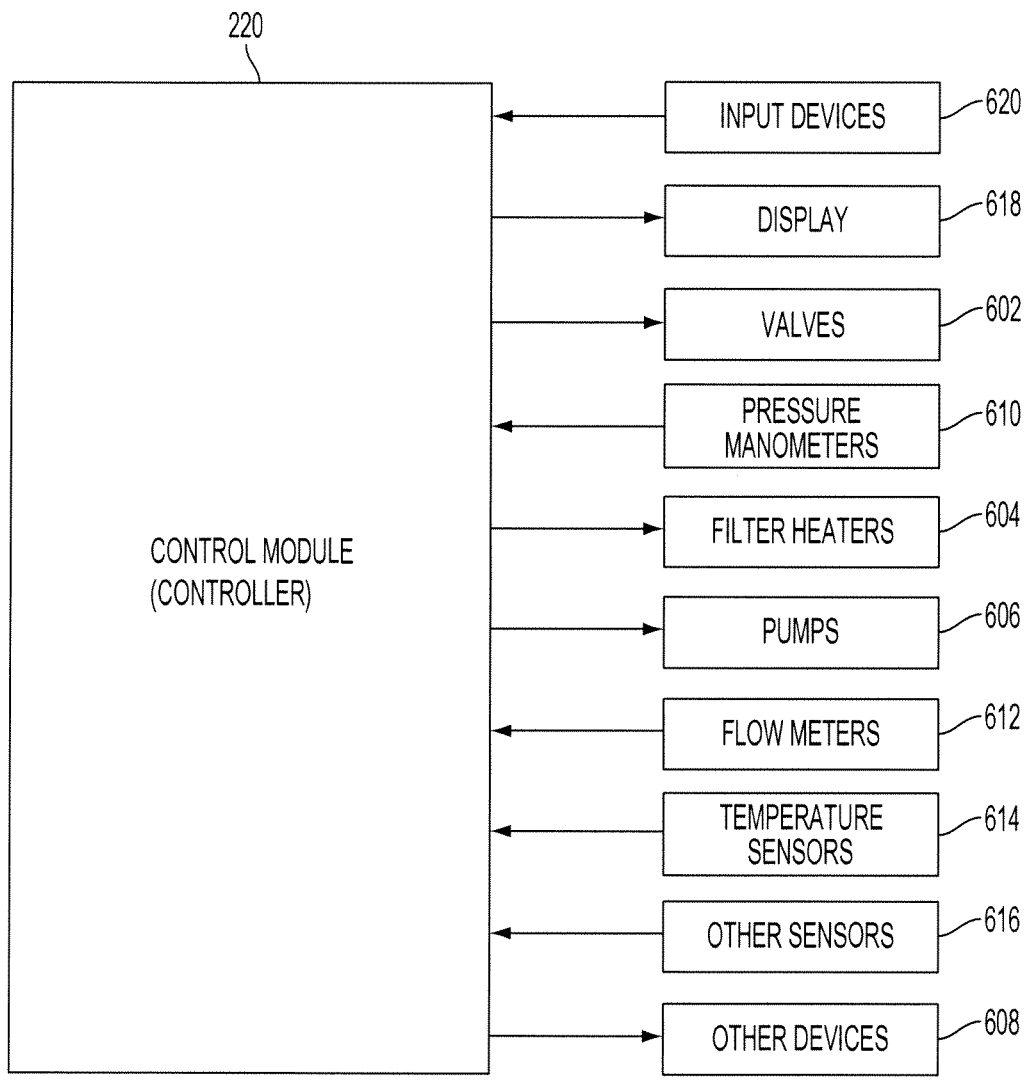
FIG. 6 illustrates a control module for controlling various aspects of a cluster tool, in accordance with one embodiment.

FIG. 6 shows a control module (i.e., controller) 220 for controlling the cluster tool assembly described above. In one embodiment, the control module 220 may include some example components, such as a processor, memory and one or more interfaces. The control module 220 may be employed to control devices in a cluster tool assembly 100 based in part on sensed values. For example only, the control module 220 may control one or more of valves 602 (including isolation valves 216, 216' of FIGS. 5A, 5B, 5C), filter heaters 604, pumps 606 (including pump 233), and other devices 608 based on the sensed values and other control parameters. The control module 220 receives the sensed values from, for example only, pressure manometers 610, flow meters 612, temperature sensors 614, and/or other sensors 616. The control module 220 may also be employed to control process conditions during precursor delivery and deposition of a film. The control module 220 will typically include one or more memory devices and one or more processors.

The control module (i.e., controller) 220 may control activities of the precursor delivery system and deposition apparatus. The control module 220 executes computer programs including sets of instructions for controlling process timing, delivery system temperature, pressure differentials across the filters, valve positions, robots and end effectors, mixture of gases, chamber pressure, chamber temperature, wafer temperature, RF power levels, wafer chuck or pedestal position, and other parameters of a particular process. The control module 220 may also monitor the pressure differential and automatically switch vapor precursor delivery from one or more paths to one or more other paths. Other computer programs stored on memory devices associated with the control module 220 may be employed in some embodiments.

Typically there will be a user interface associated with the control module 220. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber or process module components necessary to carry out the inventive deposition processes. Examples of programs or sections of programs for this purpose include substrate positioning code, process gas control code, pressure control code, heater control code, plasma control code, lift mechanism control code, robot position code, end effector position code and valve position control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck. The valve position control code may include code to control access to a process module or the cluster tool assembly by controlling isolation valves that provide access to the process module or the cluster tool, for example. The lift mechanism control code may include code to activate the actuator drive to cause the actuators to move the lift pins, for example. The robot position code may include code to manipulate the position of the robot(s) including manipulation of the robot to move along a lateral, a vertical, or a radial axis, for example. The end effector position code may include code to manipulate the position of the end effector including manipulation of the robot to extend, contract, or move along a lateral, a vertical or radial axis, for example.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

The various embodiments described herein allow the consumable parts to be replaced in a fast and efficient manner without having to open the cluster tool assembly to atmospheric conditions. As a result, the time to replace consumable parts, as well as any risk of contaminating the chamber during replacement of consumable parts is greatly reduced, thereby allowing the cluster tool assembly to come online faster. Further, risk of inadvertent damage to the process module, the consumable part and to other hardware components in the process module are greatly reduced.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A cluster tool, comprising,
a vacuum transfer module including a first robot;
a plurality of process modules coupled to the vacuum transfer module;
an atmospheric transfer module including a second robot, the atmospheric transfer module coupled to the vacuum transfer module via a load lock;
a replacement station coupled to the atmospheric transfer module, the replacement station having a part buffer with a plurality of compartments for storing a plurality of consumable parts used in one or more of the plurality of process modules; and
an isolation valve coupled between the replacement station and the atmospheric transfer module, the second robot is configured with access to the replacement station via the isolation valve to retrieve consumable parts for installation in one or more of the plurality of process modules and store consumable parts removed from one or more of the plurality of process modules,
wherein the first robot of the vacuum transfer module is configured to handle the consumable parts for installation or removal from the one or more of the plurality of process modules and the second robot of the atmospheric transfer module is configured to handle the consumable parts retrieved from the replacement station or stored when removed from the one or more of the plurality of process modules, wherein end effectors of the first robot and the second robot configured to move a wafer are also configured to move the consumable part to achieve alignment of the consumable part delivered to the one or more of the plurality of process modules, and
wherein the consumable part is geometrically different from the wafer and the replacement station storing the plurality of consumable parts is different from a wafer loader storing the wafer used in the plurality of process modules.

2. The cluster tool of claim 1, wherein at least one of the plurality of process modules includes lift pins for removing and installing one of said consumable parts.

3. The cluster tool of claim 1, wherein the replacement station is coupled to a side of the atmospheric transfer module.

4. The cluster tool of claim 1, wherein the load lock provides an exchange location for ones of the consumable parts handled between the first robot and the second robot.

5. The cluster tool of claim 1, wherein the consumable part is a replacement part of at least one of the plurality of process modules, and removal of the consumable part is performed without shutting down the process module having the consumable part replaced.

6. The cluster tool of claim 1, wherein the consumable part is an edge ring that surrounds a wafer received in the one or more of the plurality of process modules.

7. The cluster tool of claim 1, further includes a controller coupled to the atmospheric transfer module, the vacuum transfer module and the replacement station, the controller is configured to coordinate movement of the first robot and the second robot during replacement of the consumable part.

8. The cluster tool of claim 1, wherein the replacement station is an attachable unit.

9. The cluster tool of claim 1, wherein the replacement station is disposed on a front side or on a second side that is different from a side where the load lock is disposed.

10. The cluster tool of claim 1, wherein the second robot is configured with access to the wafer exchange module via the isolation valve to retrieve a wafer for processing in the plurality of process modules and to store the wafer after completion of the processing, and wherein the first robot of the vacuum transfer module is configured to handle delivery or removal of the wafer from the plurality of process modules.

11. A cluster tool , comprising, a vacuum transfer module including a first robot;

a plurality of process modules coupled to the vacuum transfer module;

a replacement station coupled to the vacuum transfer module, the replacement station having a part buffer with a plurality of compartments for storing a plurality of consumable parts used in one or more of the plurality of process modules; and an isolation valve coupled between the replacement station and the vacuum transfer module, the first robot is configured with access to the replacement station via the isolation valve to retrieve a consumable part for installation in one or more of the plurality of process modules and store consumable parts removed from the one or more of the plurality of process modules;

wherein an end effector provided in the first robot of the vacuum transfer module configured to move a wafer is also configured to move the consumable part for installation in the one or more of the plurality of process modules, to achieve alignment of the consumable part delivered to the one or more of the plurality of process modules, and wherein the consumable part is geometrically different from the wafer and the replacement station storing the plurality of consumable parts is different from a wafer loader storing the wafer used in the plurality of process modules.

12. The cluster tool of claim 11, wherein at least one of the plurality of process modules includes lift pins for removing and installing one of said consumable parts.

13. The cluster tool of claim 11, wherein the consumable part is a replacement part of at least one of the plurality of process modules, and removal of the consumable part is performed without shutting down the process module having the consumable part that is being replaced.

14. The cluster tool of claim 11, further includes a controller coupled to the vacuum transfer module, the replacement station and the one or more of the plurality of process modules, the controller configured to coordinate movement of the first robot during replacement of the consumable part.

15. The cluster tool of claim 14, further includes an atmospheric transfer module including a second robot, a first side of the atmospheric transfer module coupled to the vacuum transfer module via a load lock, a second side of the atmospheric transfer module coupled to a wafer exchange module via a load port, the second robot of the atmospheric transfer module configured with access to the wafer exchange module to retrieve wafers for processing in the plurality of process modules and store the wafers processed by the plurality of process modules.

16. The cluster tool of claim 15, wherein the load lock provides an exchange location for the wafers handled between the atmospheric transfer module and the vacuum transfer module.

17. The cluster tool of claim 15, wherein the controller is further coupled to the atmospheric transfer module, the controller is configured to coordinate movement of the first robot and the second robot during movement of wafers for processing.

18. The cluster tool of claim 11, wherein the consumable part is an edge ring that surrounds a wafer in the one or more of the plurality of process modules.

* * * * *